United States Patent
Cho et al.

(10) Patent No.: US 7,564,877 B2
(45) Date of Patent: Jul. 21, 2009

(54) DATA MULTIPLEXING METHOD, FIELD PROGRAMMABLE GATE ARRAY, AND OPTICAL NETWORK

(75) Inventors: Jae-Hun Cho, Suwon-si (KR); Jun-Ho Koh, Suwon-si (KR); Sang-Ho Kim, Hwaseong-si (KR); Kwan-Woong Song, Seongnam-si (KR); Young-Hun Joo, Suwon-si (KR); Yun-Je Oh, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 563 days.

(21) Appl. No.: 11/147,703

(22) Filed: Jun. 8, 2005

(65) Prior Publication Data

US 2006/0045081 A1 Mar. 2, 2006

(30) Foreign Application Priority Data

Aug. 24, 2004 (KR) .................. 10-2004-0066702

(51) Int. Cl.
*H04J 3/02* (2006.01)
(52) U.S. Cl. .................. 370/537; 370/412; 370/529
(58) Field of Classification Search ................ 370/490, 370/532, 537, 463, 412, 529
See application file for complete search history.

(56) References Cited

U.S. PATENT DOCUMENTS

| | | | | |
|---|---|---|---|---|
| 5,333,301 A | * | 7/1994 | Cheney et al. | ................. 714/56 |
| 5,341,371 A | * | 8/1994 | Simpson | ..................... 370/438 |
| 5,867,484 A | * | 2/1999 | Shaunfield | ............ 370/395.51 |
| 6,289,055 B1 | * | 9/2001 | Knotz | ......................... 375/286 |
| 7,386,008 B2 | * | 6/2008 | Jordan | ........................ 370/466 |
| 2002/0136243 A1 | * | 9/2002 | Dietrich et al. | ............ 370/535 |
| 2002/0146023 A1 | * | 10/2002 | Myers | ........................ 370/412 |
| 2004/0114638 A1 | * | 6/2004 | Matsuura et al. | ........... 370/537 |

\* cited by examiner

*Primary Examiner*—Jason E Mattis
(74) *Attorney, Agent, or Firm*—Cha & Reiter, LLC

(57) ABSTRACT

A field programmable gate array (FPGA) for multiplexing data and enable signals input from a plurality of input ports and outputting the multiplexed signal to one output port is disclosed. The FPGA includes a plurality of memories, which are connected to the input ports, for storing the input data and enable signals, respectively, and outputting one-shot signals at trailing edges of the enable signals; and a finite state machine (FSM) for sequentially reading the data signals stored in the memories in an order of the one-shot signals input from the memories.

16 Claims, 6 Drawing Sheets

FIG.5A COMMUNICATION

FIG.5B BROADCASTING

FIG.5C VOICE

DATA MULTIPLEXING METHOD, FIELD PROGRAMMABLE GATE ARRAY, AND OPTICAL NETWORK

CLAIM OF PRIORITY

This application claims priority under 35 U.S.C. § 119 to an application entitled "Data Multiplexing Method, Field Programmable Gate Array, and Optical Network," filed in the Korean Intellectual Property Office on Aug. 24, 2004 and assigned Serial No. 2004-66702, the contents of which are incorporated herein by reference.

BACKGROUND OF THE INVENTION

1. Field of the Invention

The present invention relates generally to an optical network, and in particular, to an optical network integrates broadcasting, communication, and voice services (hereinafter referred to as a "triple play service (TPS)").

2. Description of the Related Art

With the advancement of information & communication technologies, broadcasting, communication, and voice services are developing into an integrated service, via digitalization of broadcasting.

A conventional passive optical network (PON) having TPS integration uses Voice over Internet Protocol (VoIP) through Ethernet channels in order to provide voice service. However, in this case, quality-of-service (QoS) of voice data signals cannot be guaranteed, and communication data signal throughput cannot be guaranteed.

Accordingly, there is a demand for an optical network having TPS integration that is improved so that QoS of voice data signals can be guaranteed and communication data signal throughput can also be guaranteed.

SUMMARY OF THE INVENTION

One aspect of the present invention relates to an optical network having TPS integration that is improved so that QoS of voice data signals can be guaranteed and communication data signal throughput can also be guaranteed.

Another aspect of the present invention relates to a signal multiplexing method for preventing processing of broadcasting and voice data signals from being delayed due to a communication data signal, and a field programmable gate array (FPGA) using the same.

One embodiment of the present invention is directed to a field programmable gate array (FPGA) for multiplexing data and enable signals input from a plurality of input ports and outputting the multiplexed signal to one output port. The FPGA includes a plurality of memories, which are connected to the input ports, for storing the input data and enable signals, respectively, and outputting one-shot signals at trailing edges of the enable signals; and a finite state machine (FSM) for sequentially reading the data signals stored in the memories in an order of the one-shot signals input from the memories.

BRIEF DESCRIPTION OF THE DRAWINGS

The above and other aspects, features and embodiments of the present invention will become more apparent from the following detailed description when taken in conjunction with the accompanying drawings in which:

FIGS. 5A to 5D illustrate one-shot signals for the communication, broadcasting, and voice enable signals illustrated in FIGS. 4A to 4D.

DETAILED DESCRIPTION

An embodiment of the present invention will be described herein below with reference to the accompanying drawings. For the purposes of clarity and simplicity, well-known functions or constructions are not described in detail as they would obscure the invention in unnecessary detail.

Figure 1:
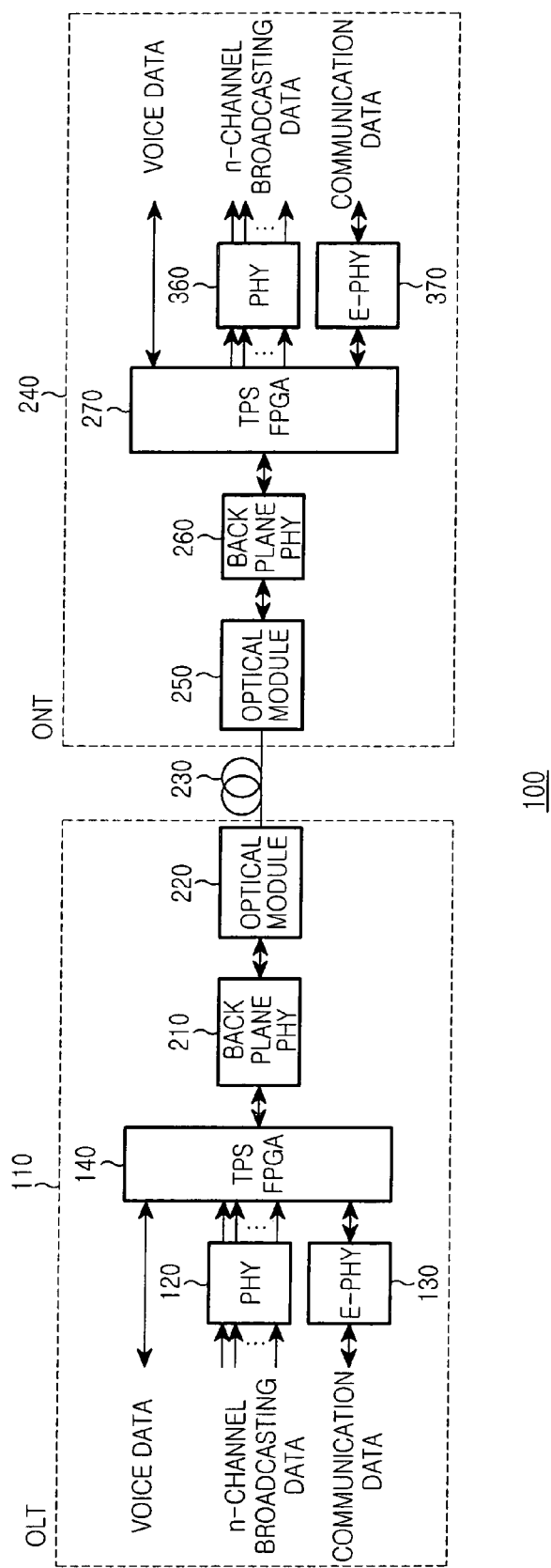
FIG. 1 is a block diagram of a PON having TPS integration according to a first embodiment of the present invention.

FIG. 1 is a block diagram of a passive optical network (PON) 100 in which a triple play service (TPS) is integrated The PON 100 includes an optical line terminal (OLT) 110 and an optical network terminal (ONT) 240, which are connected to each other via an optical fiber 230.

The OLT 110 includes a physical layer (PHY) 120, an Ethernet PHY (E-PHY) 130, a TPS field programmable gate array (TPS FPGA) 140, a back plane PHY 210, and an optical module 220. The OLT 110 multiplexes a plurality of broadcasting data signals, a communication data signal, and a voice data signal, all of which are input from the outside of the PON 100, using the TPS FPGA 140, converts the multiplexed signal to an asynchronous serial interface (ASI) signal, a serial data signal, using the back plane PHY 210, converts the converted ASI signal to an optical signal using the optical module 220, and transmits the optical signal to the ONT 240 via the optical fiber 230.

The voice data signal is directly input to the TPS FPGA 140, the broadcasting data signals are input to the TPS FPGA 140 through the PHY 120, and the communication data signal is input to the TPS FPGA 140 through the E-PHY 130. The broadcasting data signals include an MPEG-2 TS data signal, and the communication data signal includes an Ethernet data signal.

Figure 2:
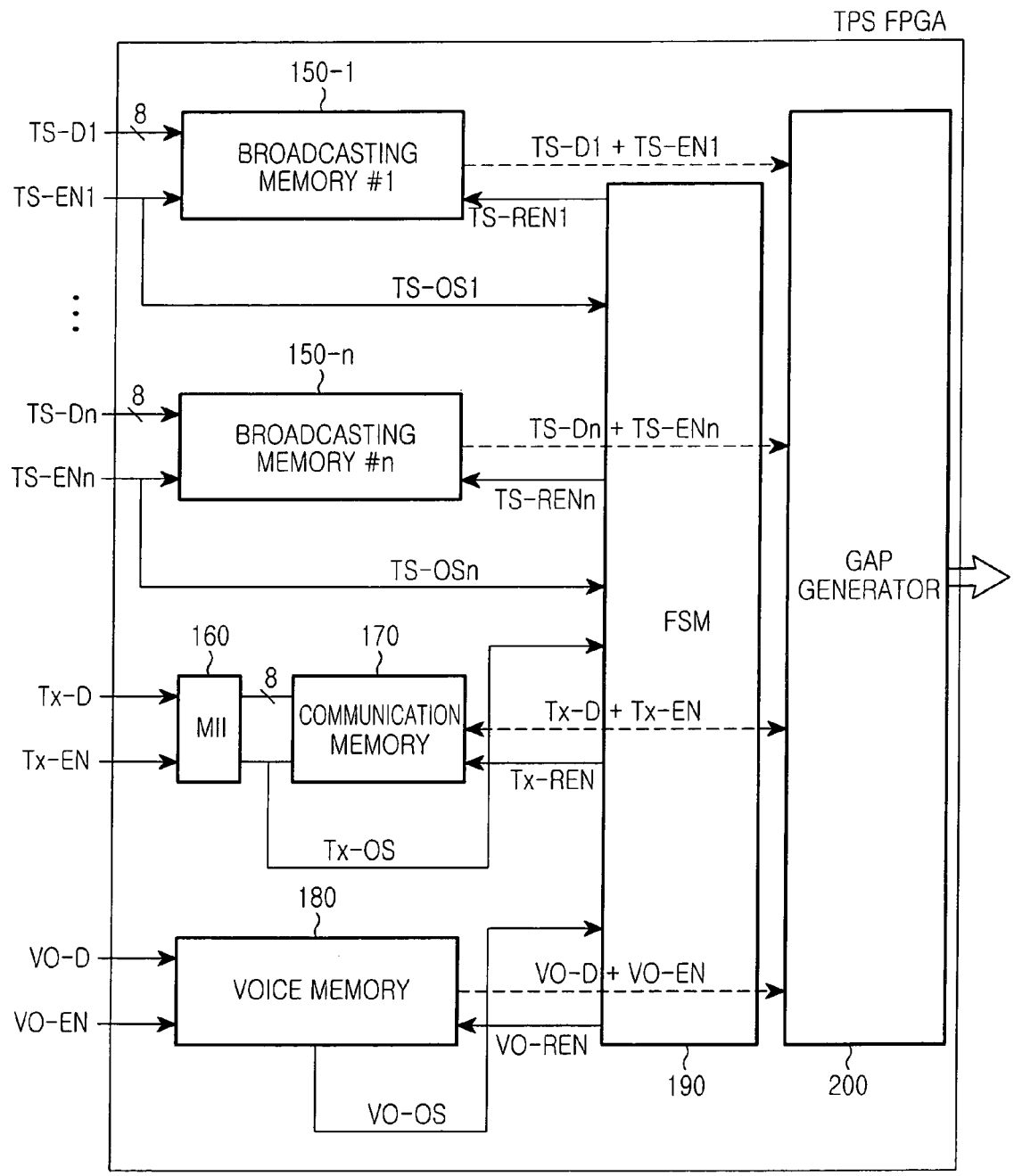
FIG. 2 is a detailed block diagram of the TPS FPGA included in the OLT shown in FIG. 1.

FIG. 2 is a detailed block diagram of the TPS FPGA 140 included in the OLT 110. The TPS FPGA 140 includes a plurality of broadcasting memories 150-1 through 150-n, a communication memory 170, a voice memory 180, a media independent interface (MII) 160, a finite state machine (FSM) 190, and a gap generator 200. The TPS FPGA 140, which has a plurality of input ports and one output port, multiplexes signals input via the input ports and outputs the multiplexed signal via the output port.

A plurality of broadcasting data signals TS-D1 through TS-Dn are input to their associated broadcasting memories 150-1 through 150-n along with broadcasting enable signals TS-EN1 through TS-ENn, respectively. For example, the $n^{th}$ broadcasting data signal TS-Dn and the $n^{th}$ broadcasting enable signal TS-ENn are input to the $n^{th}$ broadcasting memory 150-n. Each of the broadcasting memories 150-1 through 150-n stores an input broadcasting data signal after adding a one-byte port ID to the input broadcasting data signal. The TPS FPGA 140 has n input ports for the n-channel broadcasting data signals TS-D1 through TS-Dn, one input port for a communication data signal Tx-D, and one input port for a voice data signal VO-D, and a unique port ID is allocated to each input port. Each port ID is used to indicate a kind of a data signal, and the OLT 110 classifies input signals according to service using the port IDs. Each of the broadcasting memories 150-1 through 150-n includes an MPEG-2 first-in-first-out (FIFO) memory.

The voice data signal VO-D is input to the voice memory 180 along with a voice enable signal VO-EN. The voice memory 180 stores the input voice data signal VO-D after adding a one-byte port ID to the input voice data signal VO-D. The voice memory 180 includes a voice FIFO memory.

The communication data signal Tx-D is input to the MII 160 along with a communication enable signal Tx-EN, and the MII 160 converts the communication data signal Tx-D, an MII signal, to a parallel signal and outputs the parallel signal to the communication memory 170.

The communication memory 170 adds a one-byte port ID to the input communication data signal Tx-D and stores the ID-added communication data signal Tx-D along with a valid signal. The communication memory 170 includes a communication FIFO memory.

Figure 3A:
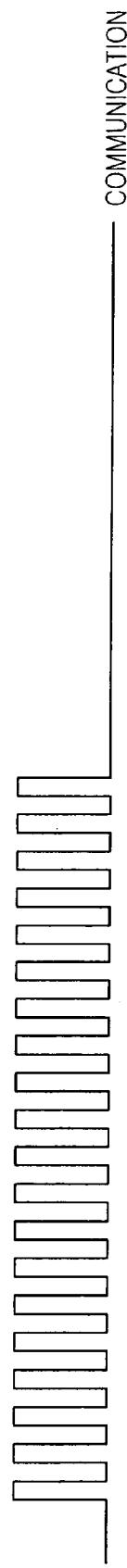
FIGS. 3A to 3C illustrate communication, broadcasting, and voice data signals input to the TPS FPGA of FIG. 2.
Figure 3B:
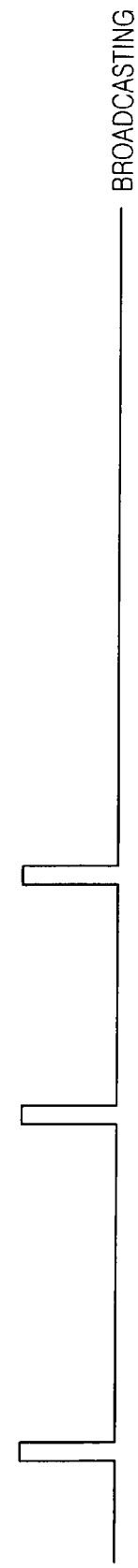
Figure 3C:
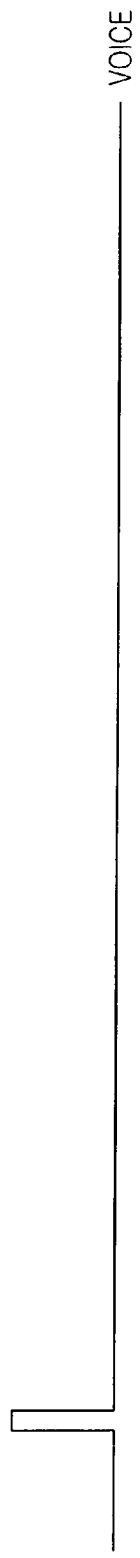

FIGS. 3A to 3C illustrate communication, broadcasting, and voice data signals input to the TPS FPGA 140. FIG. 3A illustrates the communication data signal, FIG. 3B illustrates the broadcasting data signal, and FIG. 3C illustrates the voice data signal. As shown in FIGS. 3A to 3C, the communication data signals that have a short length are continuously and repeatedly input. This causes processing delay of the broadcasting and voice data signals.

Figure 4A:
FIGS. 4A to 4D illustrate enable signals for the communication, broadcasting, and voice data signals illustrated in FIGS. 3A to 3C.
Figure 4B:
Figure 4C:
Figure 4D:

FIGS. 4A to 4D illustrate enable signals for the communication, broadcasting, and voice data signals illustrated in FIGS. 3A to 3C. FIG. 4A illustrates a communication enable signal, FIG. 4B illustrates broadcasting enable signals, FIG. 4C illustrates a voice enable signal, and FIG. 4D illustrates a processing order of the enable signals. For convenience of understanding, reference numerals 1 to 5 are assigned in order from the top, and reference numeral 1 denotes the communication enable signal, reference numerals 2, 3, and 4 denote the three broadcasting enable signals, and reference numeral 5 denotes the voice enable signal. Since an input order is 1→2→5→3→4, a typical data signal processing order follows the input order 1→2→5→3→4.

Generally, it is necessary that broadcasting and voice data signals should be dealt with earlier than the communication data signals. However, if the communication data signals having a short length are continuously and repeatedly input as shown in FIG. 3A, processing of the broadcasting and voice data signals is delayed until all of the communication data signals are processed (if all of the signals are dealt with according to a typical processing order).

In this embodiment, the processing delay of the broadcasting and voice data signals is prevented using one-shot signals.

Referring back to FIG. 2, the broadcasting memories 150-1 through 150-n output broadcasting one-shot signals TS-OS1 through TS-OSn to the FSM 190 at trailing edges of the input broadcasting enable signals TS-EN1 through TS-ENn, respectively. For example, this means at points at which each of the input broadcasting enable signals TS-EN1 through TS-ENn drops from a '1' level to a '0' level. In other words, the $n^{th}$ broadcasting memory 150-n outputs the $n^{th}$ broadcasting one-shot signal TS-OSn to the FSM 190 at a point at which the input $n^{th}$ broadcasting enable signal TS-ENn drops from the '1' level to the '0' level. The $n^{th}$ broadcasting one-shot signal TS-OSn is a signal indicating that the $n^{th}$ broadcasting data signal TS-Dn stored in the $n^{th}$ broadcasting memory 150-n can be read, and is generated during 1 clock cycle.

The voice memory 180 outputs a voice one-shot signal VO-OS to the FSM 190 at a trailing edge of the input voice enable signal VO-EN. For exaple, this means at a point at which the input voice enable signal VO-EN drops from the '1' level to the '0' level. The voice one-shot signal VO-OS indicates that the voice data signal VO-D stored in the voice memory 180 can be read, and is generated during 1 clock cycle.

The communication memory 170 outputs a communication one-shot signal Tx-OS to the FSM 190 at a trailing edge of the input communication enable signal Tx-EN. For example, this means a point at which the input communication enable signal Tx-EN drops from the '1' level to the '0' level. The communication one-shot signal Tx-OS indicates that the communication data signal Tx-D stored in the communication memory 170 can be read, and is generated during 1 clock cycle.

Figure 5D:
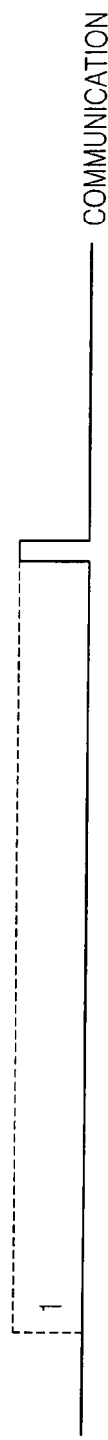
Figure 5D:
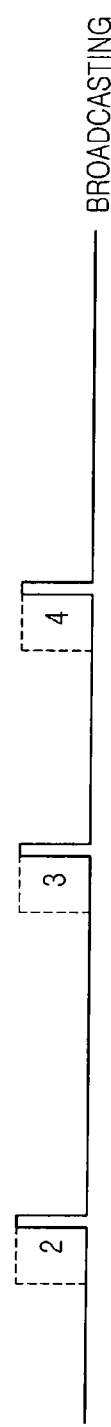
Figure 5D:
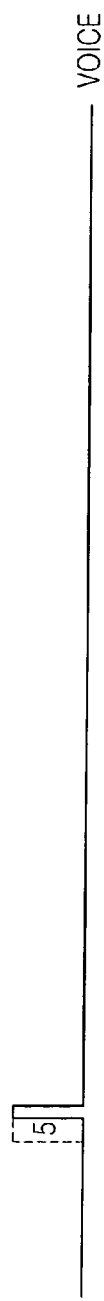
Figure 5D:
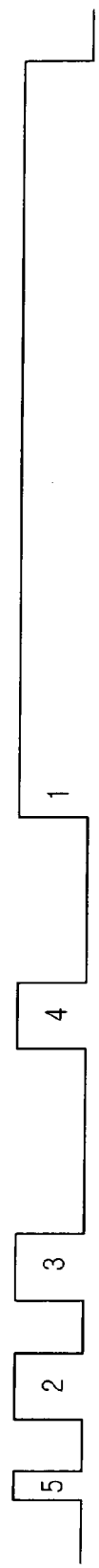

FIGS. 5A to 5D illustrate one-shot signals for the communication, broadcasting, and voice enable signals illustrated in FIGS. 4A to 4D. FIG. 5A illustrates a communication one-shot signal, FIG. 5B illustrates broadcasting one-shot signals, FIG. 5C illustrates a voice one-shot signal, and FIG. 5D illustrates a processing order of the one-shot signals. As shown in FIGS. 5A to 5D, the input order of the one-shot signals is 1→2→5→3→4. However, an output order of the one-shot signals is 5→2→3→4→1. Accordingly, the processing order of the communication, broadcasting, and voice data signals follows the output order 5→2→3→4→1.

If two or more one-shot signals are generated at the same time, they are dealt with according to pre-set priority. For example, the priority may be set in the order of voice, broadcasting, and communication enable signals. In this way, when a voice one-shot signal and a communication one-shot signal are generated at the same time, the voice data signal is first processed.

The FSM 190 outputs read enable signals to their associated memories in an order corresponding to the input one-shot signals (or the pre-set priority), respectively.

For example, if the $n^{th}$ broadcasting memory 150-n, the communication memory 170, and the voice memory 180 output the one-shot signals shown in FIGS. 5A to 5C, the FSM 190 outputs in order a voice read enable signal VO-REN to the voice memory 180, an $n^{th}$ broadcasting read enable signal TS-RENn to the $n^{th}$ broadcasting memory 150-n three times, and a communication read enable signal Tx-REN to the communication memory 170.

Upon receiving a broadcasting read enable signal, each of the broadcasting memories 150-1 through 150-n outputs stored broadcasting data and broadcasting enable signals to the gap generator 200.

Upon receiving a voice read enable signal, the voice memory 180 outputs stored voice data and voice enable signals to the gap generator 200.

Upon receiving a communication read enable signal, the communication memory 170 outputs stored communication data and communication enable signals to the gap generator 200.

The gap generator 200 manages each of input broadcasting, voice, and communication data signals so that the front and the rear of each of the input broadcasting, voice, and communication data signals have one-byte idles. The gap generator 200 additionally provides a one-byte idle to each data signal having a one-byte idle for later insertion of a comma character (called K28.5).

Referring back to FIG. 1, data and enable signals output from the TPS FPGA 140 included in the OLT 110 are input to the back plane PHY 210. The back plane PHY 210 converts the input data signal to an ASI signal, a serial signal, and outputs the ASI signal to the optical module 220. The back plane PHY 210 8B/10B-encodes the input data signal and inserts K28.5 in the front and the rear of the data signal.

The optical module 220 converts the input ASI signal to an optical signal and transmits the optical signal to the ONT 240 via the optical fiber 230.

The ONT 240 includes a PHY 360, an E-PHY 370, a TPS FPGA 270, a back plane PHY 260, and an optical module 250. The ONT 240 converts the ASI signal received via the optical fiber 230 to an electrical signal using the optical module 250, converts the converted electrical signal to a parallel signal using the back plane PHY 260, and demultiplexes the converted parallel signal into a plurality of broadcasting data signals, a communication data signal, and a voice data signal using the TPS FPGA 270. The back plane PHY 260 8B/10B-decodes an input data signal.

Figure 6:
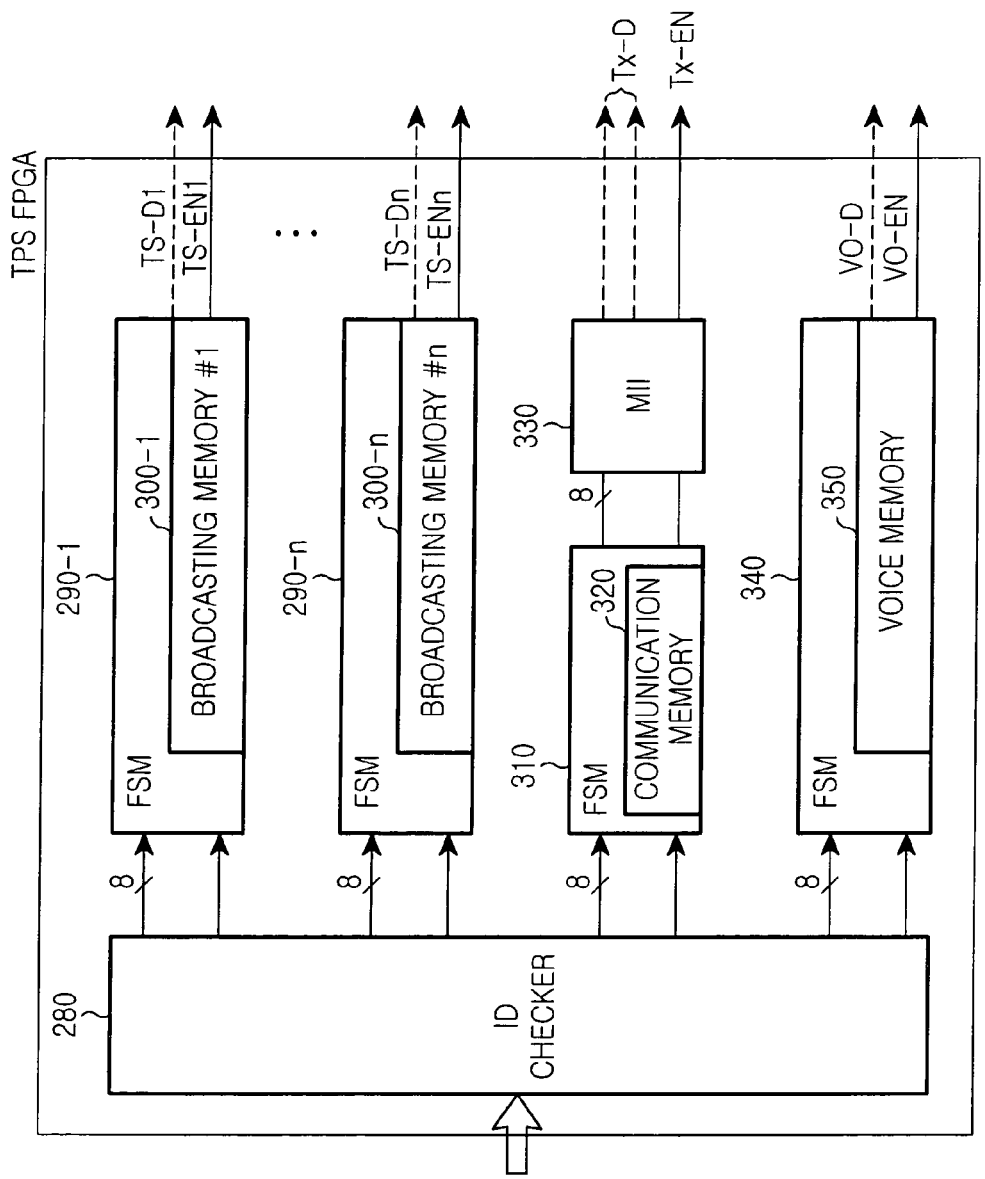
FIG. 6 is a detailed block diagram of the TPS FPGA included in the ONT shown in FIG. 1.

FIG. 6 is a detailed block diagram of the TPS FPGA 270 included in the ONT 240. Referring to FIG. 6, the TPS FPGA 270 includes a plurality of broadcasting memories 300-1 through 300-n, a communication memory 320, a voice memory 350, an MMI 330, a plurality of FSMs 290-1 through 290-n, 310, and 340, and an ID checker 280.

The ID checker 280 identifies a port ID of an input parallel signal and outputs the input parallel signal to its associated memory. The ID checker 280 outputs the input parallel signal to the first broadcasting memory 300-1 when the input parallel signal is a first broadcasting signal, to the voice memory 350 when the input parallel signal is a voice signal, and to the communication memory 320 when the input parallel signal is a communication signal.

Each of the broadcasting memories 300-1 through 300-n outputs stored broadcasting data and broadcasting enable signals to the PHY 360. The broadcasting data and broadcasting enable signals output from the PHY 360 are output to a subscriber. Each of the broadcasting memories 300-1 through 300-n includes a broadcasting FIFO memory.

The voice memory 350 outputs stored voice data and voice enable signals to the subscriber. The voice memory 350 includes a voice FIFO memory.

The communication memory 320 outputs a stored communication data signal from which a valid signal is removed and a stored communication enable signal to the MII 330. The MII 330 converts the input signals to an MII signal and outputs the converted MII signal to the E-PHY 370. The communication data and communication enable signals output from the E-PHY 370 are output to the subscriber. The communication memory 320 includes a communication FIFO memory.

The downstream signal processing process from the OLT 110 to the ONT 240 has been described. Since the upstream signal processing process from the ONT 240 to the OLT 110 is similar to the downstream signal processing process except that it is unnecessary to transmit broadcasting signals, the upstream signal processing process will now be described briefly.

The ONT 240 multiplexes communication and voice signals input from a subscriber using the TPS FPGA 270, converts the multiplexed signal to an ASI signal, a serial signal, using the back plane PHY 260, converts the converted ASI signal to an optical signal using the optical module 250, and transmits the optical signal to the OLT 110 via the optical fiber 230.

The voice data signal is directly input to the TPS FPGA 270 and the communication data signal is input to the TPS FPGA 270 through the E-PHY 370.

The voice data signal is input to the voice memory 350 along with a voice enable signal. The voice memory 350 stores the input voice data signal after adding a one-byte port ID to the input voice data signal.

The communication data signal is input to the MII 330 along with a communication enable signal, and the MII 330 converts the communication data signal, an MII signal, to a parallel signal and outputs the parallel signal to the communication memory 320.

The communication memory 320 adds a one-byte port ID to the input communication data signal and stores the ID-added communication data signal along with a valid signal.

The voice and communication memories 350 and 320 output voice and communication one-shot signals to voice and communication FSMs 340 and 310 linked to each other, respectively. The voice and communication FSMs 340 and 310 output read enable signals to their associated memories in an order of input one-shot signals (or the pre-set priority), respectively.

Upon receiving a voice read enable signal, the voice memory 350 outputs stored voice data and voice enable signals to the ID checker 280.

Upon receiving a communication read enable signal, the communication memory 320 outputs stored communication data and communication enable signals to the ID checker 280.

The ID checker 280 manages each of the input voice and communication data signals so that the front and the rear of each of the input voice and communication data signals have one-byte idles.

The data and enable signals output from the TPS FPGA 270 included in the ONT 240 are input to the back plane PHY 260. The back plane PHY 260 converts the input data signal to an ASI signal, a serial signal, and outputs the ASI signal to the optical module 250. The back plane PHY 260 8B/10B-encodes the input data signal and inserts K28.5 in the front and the rear of the data signal.

The optical module 250 converts the input ASI signal to an optical signal and transmits the optical signal to the OLT 110 via the optical fiber 230.

The OLT 110 processes the ASI signal input via the optical fiber 230 in the same way as the downstream signal processing process of the ONT 240.

In the embodiment described above, an FPGA is applied to a PON. However, the FPGA can be applied to any optical network including at least two nodes performing mutual optical communications. That is, in an optical network including at least two nodes connected to each other via an optical fiber, one node multiplexes a plurality of signals input from the outside using the FPGA, converts the multiplexed signal to an ASI signal, a serial signal, using a back plane PHY, converts the converted ASI signal to an optical signal using an optical module, and transmits the converted optical signal to another node using the optical fiber. The FPGA includes a plurality of memories for storing input data and enable signals and outputting one-shot signals at trailing edges of the enable signals and a FSM for sequentially reading the data signals stored in the memories in an order of the one-shot signals input from the memories. The data signals may include broadcasting, voice, and communication signals. The FPGA may further include a gap generator for managing the signals input from the memories so that the front and the rear of each of the signals input from the memories have one-byte idles. The FSM can process two or more one-shot signals input at the same time according to pre-set priority. Each of the memories may store an input data signal after adding a port ID indicating its associated input port to the input data signal.

As described above, in one embodiment, a signal multiplexing method and an FPGA using the same can prevent a processing delay of broadcasting and voice data signals due to communication data signals by using one-shot signals.

Also, an optical network, in which TPS integration is achieved, having an FPGA using one-shot signals can guarantee QoS of voice data signals and 100% guarantee communication data signal throughput.

While the invention has been shown and described with reference to a certain embodiments thereof, it will be understood by those skilled in the art that various changes in form and details may be made therein without departing from the spirit and scope of the invention as defined by the appended claims.

What is claimed is:

1. A field programmable gate array (FPGA) for multiplexing data and enable signals input from a plurality of input ports and outputting the multiplexed signal to one output port, the FPGA comprising:
   a plurality of memories, which are connected to the input ports, that store the input data and enable signals, respectively, and output one-shot signals from one or more memories of said plurality of memories, respectively, at trailing edges of the enable signals; and
   a finite state machine (FSM) that sequentially reads the data signals stored in the memories in an input order of the one-shot signals input from the memories by outputting read enable signals to the memories according to the input order of the one-shot signals,
   wherein the memories output the stored data signals in an input order of the read enable signals input from the FSM, and wherein a corresponding pair of the data and enable signals is input to each of said plurality of memories at the same time.

2. The FPGA of claim 1, wherein the data signals comprise broadcasting, voice, and communication signals.

3. The FPGA of claim 1, further comprising a gap generator arranged to manage the signals input from the plurality of memories so that the front and the rear of each of the signals input from the plurality of memories have one-byte idles.

4. The FPGA of claim 1, wherein when two or more one-shot signals are input at the same time, the FSM processes the one-shot signals according to a pre-set priority.

5. The FPGA of claim 1, wherein each of the plurality of memories stores an input data signal after adding a port ID indicating its associated input port to the input data signal.

6. The FPGA of claim 2, wherein the data signals in the plurality of memories include a communication memory, a voice memory, and a broadcasting memory, and each type of memory respectively outputs one of a communication one-shot signal, a voice one-shot signal, and a broadcast one-shot signal.

7. The FPGA of claim 6, wherein an output order of the communication one-shot signal, voice one-shot signal, and broadcast one-shot signal does not follow a First In, First Out, order.

8. A data multiplexing method for multiplexing data and enable signals input from a plurality of input ports and outputting the multiplexed signal to one output port, the method comprising the steps of:
   storing the input data and enable signals in a plurality of memories;
   generating one-shot signals at trailing edges of the enable signals;
   sequentially reading the data signals stored according to a generating order of the one-shot signals by generating read enable signals according to the generating order of the one-shot signals; and
   outputting the stored data signals according to a generating order of the read enable signals, wherein a corresponding pair of the data and enable signals is input to each of said plurality of memories at the same time.

9. An optical line terminal (OLT) in a passive optical network (PON) including the OLT and an optical network terminal (ONT), which are connected to each other using an optical fiber,
   wherein the OLT multiplexes a plurality of signals input from the outside using a field programmable gate array (FPGA); converts the multiplexed signal to an asynchronous serial interface (ASI) signal using a back plane physical layer; converts the converted ASI signal to an optical signal using an optical module; and transmits the converted optical signal to the ONT using the optical fiber,
   wherein the FPGA comprises:
   a plurality of memories arranged to store input data and enable signals and output one-shot signals from one or more memories of said plurality of memories, respectively, at trailing edges of the enable signals; and
   a finite state machine (FSM) arranged to sequentially read the data signals stored in the plurality of memories in an input order of the one-shot signals input from the plurality of memories by outputting read enable signals to the memories according to the input order of the one-shot signals,
   wherein the memories output the stored data signals in an input order of the read enable signals input from the FSM, and
   wherein a corresponding pair of the data and enable signals is input to each of said plurality of memories at the same time.

10. The OLT of claim 9, wherein the data signals comprise broadcasting, voice, and communication signals.

11. The OLT of claim 9, further comprising a gap generator arranged to manage the signals input from the plurality of memories so that the front and the rear of each of the signals input from the plurality of memories have one-byte idles.

12. The OLT of claim 9, wherein when two or more one-shot signals are input at the same time, the FSM processes the one-shot signals according to a pre-set priority.

13. The OLT of claim 9, wherein the data signals in the plurality of memories include a communication memory, a voice memory, and a broadcasting memory, and each type of memory respectively outputs one of a communication one-shot signal, a voice one-shot signal, and a broadcast one-shot signal.

14. The OLT of claim 13, wherein an output order of the communication one-shot signal, voice one-shot signal, and broadcast one-shot signal does not follow a First In, First Out, order.

15. An optical network terminal (ONT) in a passive optical network (PON) including an optical line terminal (OLT) and the ONT, which are connected to each other using an optical fiber,
   wherein the ONT multiplexes a plurality of signals input from a subscriber using a field programmable gate array (FPGA); converts the multiplexed signal to an asynchronous serial interface (ASI) signal using a back plane physical layer; converts the converted ASI signal to an optical signal using an optical module; and transmits the converted optical signal to the OLT using the optical fiber,
   wherein the FPGA comprises:
   a plurality of memories configured for storing input data and enable signals and outputting one-shot signals from one or more memories of said plurality of memories, respectively, at trailing edges of the enable signals; and a finite state machine (FSM) configured for sequentially reading the data signals stored in the plurality of memories in an input order of the one-shot signals input from the plurality of memories by outputting read enable signals to the memories according to the input order of the one-shot signals, wherein the memories output the stored data signals in an input order of the read enable signals input from the FSM, and wherein a corresponding pair of the data and enable signals is input to each of said plurality of memories at the same time.

16. An optical network including at least two nodes connected to each other using an optical fiber, wherein at least one of the two nodes multiplexes a plurality of signals input from the outside using a field programmable gate array (FPGA), converts the multiplexed signal to an asynchronous serial interface (ASI) signal using a back plane physical layer, converts the converted ASI signal to an optical signal using an optical module, and transmits the converted optical signal to another node using the optical fiber, wherein the FPGA comprises:

a plurality of memories for storing input data and enable signals and outputting one-shot signals at trailing edges of the enable signals from one or more memories of said plurality of memories, respectively; and a finite state machine (FSM) for sequentially reading the data signals stored in the plurality of memories in an input order of the one-shot signals input from the plurality of memories by outputting read enable signals to the memories according to the input order of the one-shot signals, wherein the memories output the stored data signals in an input order of the read enable signals input from the FSM, and wherein a corresponding pair of the data and enable signals is input to each of said plurality of memories at the same time.

* * * * *